(12) United States Patent
Elofsson et al.

(10) Patent No.: US 12,006,250 B2
(45) Date of Patent: *Jun. 11, 2024

(54) GLAZING AND METHOD OF ITS PRODUCTION (71) Applicant: MIMSI Materials AB, Linköping (SE)

(72) Inventors: Viktor John Elofsson, Nykil (SE); Mattias Samuelsson, Linköping (SE); Sankara Pillay, Linköping (SE)

(73) Assignee: MIMSI Materials AB, Linköping (SE)

( * ) Notice: Subject to any disclaimer, the term of this patent is extended or adjusted under 35 U.S.C. 154(b) by 0 days.

This patent is subject to a terminal disclaimer.

(21) Appl. No.: 18/199,124

(22) Filed: May 18, 2023

(65) Prior Publication Data
US 2023/0312409 A1 Oct. 5, 2023

Related U.S. Application Data (63) Continuation of application No. 17/287,297, filed as application No. PCT/EP2019/078654 on Oct. 22, 2019, now Pat. No. 11,685,688.

(30) Foreign Application Priority Data

Oct. 22, 2018 (SE) .................... 1851302-8

(51) Int. Cl.
C03C 17/36 (2006.01)
C03C 17/09 (2006.01)
(Continued)

(52) U.S. Cl.
CPC .......... *C03C 17/3647* (2013.01); *C03C 17/09* (2013.01); *C03C 17/3639* (2013.01);
(Continued)

(58) Field of Classification Search
CPC ............ C03C 17/3644; C03C 17/3647; C03C 17/3681; C03C 2217/256; B32B 17/1022;
(Continued)

(56) References Cited

U.S. PATENT DOCUMENTS 4,320,169 A 3/1982 Yatabe
6,030,671 A 2/2000 Yang et al.
(Continued)

FOREIGN PATENT DOCUMENTS

CN 104979037 A 10/2015
CN 107077906 A 8/2017
(Continued)

OTHER PUBLICATIONS

Swedish Search Report for Swedish Application No. 1851302-8, dated Apr. 9, 2019 (2 pages).
(Continued)

Primary Examiner — Z. Jim Yang
(74) Attorney, Agent, or Firm — Kagan Binder, PLLC (57) ABSTRACT The present document discloses a glazing in the form of a window glass or vehicle glass which comprises a transparent glass substrate, and a coating, which comprises at least one functional metal Ag alloy coating layer. The alloy coating layer consists essentially of Ag with an alloying agent selected from a group consisting of Mg, Al, Si, Ca, Ti, V, Cr, Mn, Fe, Ni, Cu, Zn, Ge, Zr, Nb, Mo, In, Sn, Hf, Ta or W. An alloying agent concentration is 0.15-1.35 at. %, preferably 0.20-1.00 at. % or 0.25-0.80 at. % of the Ag alloy coating layer, the rest being Ag, and the Ag alloy coating layer has a thickness of 5-20 nm, preferably 8-15 nm or more preferably 8-12 nm.

17 Claims, 4 Drawing Sheets (51) Int. Cl.
  *C22C 5/06* (2006.01)
  *C23C 14/18* (2006.01)
  *C23C 14/35* (2006.01)
  *G02B 1/113* (2015.01)

(52) U.S. Cl.
  CPC ........ *C03C 17/366* (2013.01); *C03C 17/3681* (2013.01); *C22C 5/06* (2013.01); *C23C 14/185* (2013.01); *C23C 14/35* (2013.01); *G02B 1/113* (2013.01); *C03C 2217/73* (2013.01); *C03C 2218/156* (2013.01)

(58) Field of Classification Search
  CPC .. B32B 17/10229; G02B 5/281; G02B 5/282; G02B 5/285; G02B 5/0858; C22C 5/06
  See application file for complete search history.

(56) References Cited

U.S. PATENT DOCUMENTS

| | | | |
|---|---|---|---|
| 7,005,189 | B1 | 2/2006 | Tachibana et al. |
| 7,132,130 | B1 | 11/2006 | Kloss |
| 2002/0034603 | A1 | 3/2002 | Nee |
| 2002/0037414 | A1 | 3/2002 | Cunningham |
| 2002/0140885 | A1* | 10/2002 | Ueno ................. G02B 5/0858 349/113 |
| 2003/0227250 | A1 | 12/2003 | Nee |
| 2005/0170132 | A1 | 8/2005 | Nee |
| 2006/0068227 | A1 | 3/2006 | Ukishima et al. |
| 2006/0255727 | A1 | 11/2006 | Nee |
| 2007/0131276 | A1 | 6/2007 | Nee |
| 2007/0259191 | A1 | 11/2007 | Simons et al. |
| 2009/0057141 | A1 | 3/2009 | Tauchi et al. |
| 2011/0169399 | A1 | 7/2011 | Ito et al. |
| 2012/0225317 | A1 | 9/2012 | Imran et al. |
| 2013/0059137 | A1 | 3/2013 | Hevesi et al. |
| 2013/0118673 | A1 | 5/2013 | Frank et al. |
| 2013/0216861 | A1 | 8/2013 | Imran et al. |
| 2014/0017472 | A1 | 1/2014 | Coster et al. |
| 2014/0170413 | A1 | 6/2014 | Hassan et al. |
| 2014/0170434 | A1 | 6/2014 | Hassan et al. |
| 2015/0004383 | A1 | 1/2015 | Sandre-Chardonnal |
| 2015/0093587 | A1 | 4/2015 | Imamura et al. |
| 2016/0297708 | A1 | 10/2016 | Brossard |
| 2017/0200526 | A1 | 7/2017 | Guo et al. |
| 2017/0227694 | A1 | 8/2017 | Nakanishi et al. |
| 2018/0072616 | A1 | 3/2018 | Brossard et al. |
| 2018/0096748 | A1 | 4/2018 | Kim et al. |
| 2018/0244569 | A1 | 8/2018 | Lu et al. |
| 2018/0297891 | A1 | 10/2018 | Goodwin et al. |
| 2019/0105872 | A1 | 4/2019 | Nakazawa et al. |
| 2019/0185374 | A1 | 6/2019 | Kwon et al. |
| 2019/0204480 | A1 | 7/2019 | Thiel et al. |

FOREIGN PATENT DOCUMENTS

| | | |
|---|---|---|
| DE | 4422830 A1 | 1/1995 |
| DE | 102009051796 A1 | 5/2011 |
| EP | 1155816 A1 | 12/1999 |
| EP | 1043606 A1 | 10/2000 |
| EP | 1371745 A1 | 12/2003 |
| EP | 1889930 A1 | 2/2008 |
| EP | 2804843 A1 | 11/2014 |
| EP | 3435385 A1 | 1/2019 |
| JP | H06345491 A | 12/1994 |
| JP | 2004002929 A | 1/2004 |
| JP | 2009151963 A | 7/2009 |
| JP | 2017031503 A | 2/2017 |
| KR | 20100057442 A | 5/2010 |
| SE | 543408 C2 | 1/2021 |
| WO | 97/08357 A1 | 3/1997 |
| WO | 2008107327 A1 | 9/2008 |
| WO | 2013107983 A1 | 7/2013 |
| WO | 2015093512 A1 | 6/2015 |
| WO | 2018038329 A1 | 3/2018 |
| WO | 2018091556 A1 | 5/2018 |
| WO | 2018160616 A2 | 9/2018 |
| WO | 2019126338 A1 | 6/2019 |
| WO | 2020083873 A1 | 4/2020 |

OTHER PUBLICATIONS

De Silva et al., "Optical properties and oxidation of α-phase Ag—Al thin films," Nanotechnology, vol. 28, pp. 1-10, 2017, (11 pages).
Gu et al., "Ultrasmooth and Thermally Stable Silver-Based Thin Films with Subnanometer Roughness by Aluminum Doping," ACSNANO, vol. 8, No. 10, pp. 10343-10351, 2014, (9 pages).
Kim et al., "Improvement of the thermal stability of silver metallization," Journal of Applied Physics, vol. 94, No. 8, pp. 5393-5395, 2003, (4 pages).
Loka et al., "Thermally stable and high reflectivity Al-doped silver thin films deposited by magnetron sputtering," Materials Research Express, vol. 5, No. 3, 2018, (8 pages).
Sugawara et al., "Comparison of the agglomeration behavior of Ag(Al) films and Ag(Au) films," Microelectronic Engineering, vol. 84, pp. 2476-2480, 2007, (5 pages).
Sugimoto et al., "Thermal durability of AZO/Ag(Al)/AZO transparent conductive films," Japanese Journal of Applied Physics, vol. 55, pp. 1-6, 2016, (7 pages).
Sugimoto et al., "Effect of Al doping in the Ag layer of MgZnO/Ag/MgZnO dielectric/metal/dielectric UV-visible transparent conductive films," Phys. Status Solidi C, vol. 13, No. 7-9, pp. 568-571, 2016, (4 pages).
Zhang et al., "An Ultrathin, Smooth, and Low-Loss Al-Doped Ag Film and Its Application as a Transparent Electrode in Organic Photovoltaics," Advanced Materials, vol. 26, pp. 5696-5701, 2014, (6 pages).
E-Space English Abstract and Machine Translation for CN104979037A.
E-Space English Abstract and Machine Translation for CN107077906A.
E-Space English Abstract and Machine Translation for DE4422830A1.
E-Space English Abstract and Machine Translation for EP1371745A1.
E-Space English Abstract and Machine Translation for JP2004002929A.
E-Space English Abstract and Machine Translation for JP2009151963A.
E-Space English Abstract and Machine Translation for JPH06345491A.
E-Space English Abstract and Machine Translation for KR20100057442A.
WIPO English Abstract for WO2013107983A1.
WIPO English Abstract for WO2018091556A1.
International Search Report and Written Opinion for International Application No. PCT/EP2019/078654, dated Jan. 31, 2020 (15 pages).
E-Space English Abstract for DE 102009051796 A1.
E-Space English Abstract for JP 2017031503 A.
E-Space English Abstract for WO 2008107327 A1.
E-Space English Abstract for WO 2015093512 A1.
E-Space English Abstract for WO 2018038329 A1.

* cited by examiner

GLAZING AND METHOD OF ITS PRODUCTION

CROSS-REFERENCE TO RELATED APPLICATIONS

This application is a Continuation of Ser. No. 17/287,297, filed Apr. 21, 2021, and titled "GLAZING AND METHOD OF ITS PRODUCTION", which in turn claims priority to International Application No. PCT/EP2019/078654, filed Oct. 22, 2019, and titled "GLAZING AND METHOD OF ITS PRODUCTION", which in turn claims priority from Swedish Application having serial number 1851302-8, filed on Oct. 22, 2018, all of which are incorporated herein by reference in their entireties.

TECHNICAL FIELD

The present disclosure relates to a glazing for use as window glass or vehicle glass and a method of producing a glazing.

BACKGROUND

Glazings with a high visible transmittance and high infrared (IR) reflectance are desirable in many applications, allowing visible light to pass through the glazing while reflecting IR radiation to reduce heat transfer through the glazing.

Common types of glazings that are used in architectural applications include clear and tinted float glass, tempered glass, laminated glass as well as a variety of coated glasses, all of which can be glazed singly or as double, or even triple, glazing units.

It is known to provide coatings on window glass in order to reduce the amount of heat that is transferred through the glass. The most efficient type of coating comprises at least one functional metal layer, which typically is made of silver (Ag) owing to its high IR reflectivity characteristics.

The functional metal layer is deposited between anti-reflective layers which each typically include at least one dielectric layer for tuning the optical properties of the glazing. These anti-reflective layers also ensure the protection of the functional metal layer from chemical attack and/or mechanical stress.

The optical and electrical properties of the glazing are directly related to the quality of the functional metal layer in terms of, e.g., crystallinity, grain size and interfacial roughness.

US 2006/0255727 A1 is related to a thin film reflector and transparent electrical conductor for use as, e.g., window coating, comprising a transparent substrate coated with a stack of layers comprising a functional metal layer of a Ag alloy.

US 2013/00118673 A1 discloses a glazing having a coating stack which may include an IR reflecting layer formed of Ag or Ag alloy, and that a particular range of alloying agent concentrations may help the Ag maintain the desirable optical characteristics of the Ag layer while enhancing chemical, corrosion and/or mechanical durability.

A particular challenge is to increase reflectance of rays in the long wavelength IR part of the spectrum, such as 5-50 µm, while maintaining high transmission of light in the visible spectrum, such as 380-780 nm. Yet another challenge is to increase reflectance in the near IR part of the spectrum, such as 780-2500 nm, while maintaining high transmission of light in the visible spectrum, such as 380-780 nm.

SUMMARY

It is an object of the present disclosure to provide a glazing for use as window glass or vehicle glass.

A further object is to provide a method of producing a glazing.

The invention is defined by the appended independent claims. Embodiments are set forth in the dependent claims, in the following description and in the drawings.

According to a first aspect there is provided a glazing in the form of a window glass or vehicle glass. The glazing comprises a transparent glass substrate and a coating. The coating comprises at least one functional metal Ag alloy coating layer. The Ag alloy coating layer consists essentially of Ag with an alloying agent selected from a group consisting of Mg, Al, Si, Ca, Ti, V, Cr, Mn, Fe, Ni, Cu, Zn, Ge, Zr, Nb, Mo, In, Sn, Hf, Ta or W. An alloying agent concentration is 0.15-1.35 at. %, preferably 0.20-1.00 at. % or 0.25-0.80 at. % of the Ag alloy coating layer, the rest being Ag, and the Ag alloy coating layer has a thickness of 5-20 nm, preferably 8-15 nm or more preferably 8-12 nm.

By "glazing" is herein meant a transparent substrate coated with a stack of thin film materials or layers.

The glazing can be used as a glass component of a building's facade or internal surfaces (such as the glass panes in an insulated glass unit), and is also used to refer to the glass used in transport and utility vehicles (such as windshields and panoramic roofs).

The glazing may be transparent. By transparent is herein meant a glazing having visible light transmission typically of the order of 20-85%.

The glazing may be a sheet. Such a sheet may be planar, single curved or double curved.

By window glass is herein meant a window glass for a building. It may also be a roof glass, glass façade or a door glass.

By vehicle glass is meant a glass for a vehicle, for example a rear glass, side glass, sun roof, windshield or a windscreen (front window) in a car.

By transparent substrate is here meant a substrate having visible light transmission typically of the order of 30-90%.

The transparent substrate may be substantially planar.

By "consists essentially of" is herein meant that the Ag alloy coating layer consists essentially of, or consists of, Ag and an alloying agent. The Ag alloy coating layer contains substantially only elemental silver, and the alloying agent and does not contain substantial amounts of silver compounds, but may contain insubstantial or incidental amounts of impurities ordinarily associated with silver and may also contain incidental insubstantial or substantial amounts of materials that do not materially affect the basic and novel characteristics of the Ag alloy coating layer.

As a non-limiting example, the Ag alloy coating layer may contain less than 0.1 wt. %, preferably less than 0.05 wt. %, most preferably less than 0.01 wt. % of other components, such as incidental impurites.

The alloying agent concentration is herein calculated as a ratio of the alloying agent to the sum of the amounts of the silver and the alloying agent. This means that possible incidental impurities are not included in the alloying agent concentration.

The layers of the coating may, but need not, form a continuous layer onto the layer it is deposited upon or substrate.

The optical properties and the electrical properties of the glazing are directly related to the quality of the functional metal layer in terms of, e.g., crystallinity, grain size and interfacial roughness.

Experimental data discussed in the following description show that the coating of the glazing, where the functional Ag metal alloy layer has alloying agent concentrations in the interval above, has improved characteristics in terms of lower sheet resistance as compared to a coating with an unalloyed Ag functional metal layer.

This is surprising, in view of the fact that US 2013/0118673 A1 discloses a potential to merely maintain the desirable optical properties.

The glazing may present a direct solar transmittance, as determined according to the European standard EN 410, which is lower than a direct solar transmittance of a glazing having a coating with the same layer structure and layer thicknesses as the Ag alloy coating layer, but wherein the functional metal Ag alloy coating layer is replaced by an unalloyed Ag functional metal layer.

In particular, the glazing may presents a direct solar transmittance, as determined according to the European standard EN 410, which is at least 1%, preferably at least 2% lower than a direct solar transmittance of a glazing having a coating with the same layer structure and layer thicknesses as the Ag alloy coating layer, but wherein the functional metal Ag alloy coating layer is replaced by an unalloyed Ag functional metal layer.

The glazing may present a direct solar reflectance, as determined according to the European standard EN 410, which is higher than a direct solar reflectance of a glazing having a coating with the same layer structure and layer thicknesses as the Ag alloy coating layer, but wherein the functional metal Ag alloy coating layer is replaced by an unalloyed Ag functional metal layer.

In particular, the glazing may present a direct solar reflectance, as determined according to the European standard EN 410, which is at least 3%, preferably at least 5% higher than a direct solar reflectance of a glazing having a coating with the same layer structure and layer thicknesses as the Ag alloy coating layer (15), but wherein the functional metal Ag alloy coating layer is replaced by an unalloyed Ag functional metal layer.

The alloying agent concentration may be 0.15-0.35 at. %, 0.35-0.55 at. %, 0.55-0.75 at. %, 0.75-0.95 at. %, 0.95-1.15 at. %, 1.15-1.35 at. % of the coating layer, the rest being Ag.

The coating may present an electrical sheet resistance which is lower than an electrical sheet resistance of a coating having the same layer structure and layer thicknesses as the aforementioned coating, but wherein the functional metal Ag alloy coating layer is replaced by an unalloyed Ag functional metal layer.

As will be discussed further on, it is both unexpected and surprising that the sheet resistance is particularly low for an alloying agent concentration in the interval of about 0.15 at. % to 1.35 at. %.

A lower sheet resistance is the equivalent to a lower emissivity or a higher IR reflectivity, which in turn corresponds to less heat that is allowed to pass through the glass pane, i.e., the glazing has a higher energy saving potential. A lower sheet resistance may also mean a higher quality of the functional metal layer, which could lead to less light absorption within the material and thus higher visible transmittance.

The conductivity of the functional metal layer is directly related to its emissivity, such that a higher conductivity (equivalent to a lower resistivity) leads to a lower emissivity.

A low emissivity is equivalent to a high IR reflectivity. High IR reflectivity is thus the same as saying a low emissivity or a high electrical conductivity. With "high" it is meant a conductivity that is higher than that of an unalloyed Ag functional metal layer for the same functional metal layer thickness.

By emissitivity of a material means its effectiveness in emitting energy as thermal radiation.

The coating may present an electrical sheet resistance which is at least 1%, preferably at least 3%, most preferably at least 5% lower than an electrical sheet resistance of a coating having the same layer structure and layer thicknesses as the aforementioned coating, but wherein the functional metal Ag alloy coating layer is replaced by an unalloyed Ag functional metal layer.

The coating may further comprise at least two anti-reflective layers, each having at least one dielectric layer, wherein each functional metal layer is sandwiched between two anti-reflective layers.

The coating may further comprise at least one blocker layer located immediately above and in direct contact with the functional metal layer.

The coating may further comprise at least one seed layer located immediately below and in contact with the functional metal layer.

The coating may further comprise at least one diffusion barrier layer located immediately on top of the transparent substrate.

The coating may further comprise at least one top layer located immediately onto the outermost anti-reflective layer.

The glazing may further comprise at least one further functional metal Ag alloy coating layer. The at least one further functional metal Ag alloy coating layer may consist essentially of Ag with an alloying agent selected from a group consisting of Mg, Al, Si, Ca, Ti, V, Cr, Mn, Fe, Ni, Cu, Zn, Ge, Zr, Nb, Mo, In, Sn, Hf, Ta or W. The alloying agent concentration of the at least one further functional metal Ag alloy coating layer may be 0.15-1.35 at. %, preferably 0.20-1.00 at. % or 0.25-0.80 at. %, the rest being Ag, and the at least one further Ag alloy coating layer may have a thickness of 5-20 nm, preferably 8-15 nm or more preferably 8-12 nm.

By at least one further functional metal Ag alloy coating layer is meant that the the glazing may comprise additional functional metal layers. Typically, such a glazing comprises two or three functional metal layers.

Hence, the alloying agent of the at least one further functional metal Ag alloy coating layer may be the same as the alloying agent of the first functional metal Ag alloy coating layer. Alternatively, the alloying agent of the at least one further functional metal Ag alloy coating layer and the alloying agent of the first functional metal Ag alloy coating layer may be different.

The alloying agent concentration of the at least one further functional metal Ag alloy coating layer may be the same as the alloying agent concentration of the first functional metal Ag alloy coating layer. Alternatively, the alloying agent concentration of the at least one further functional metal Ag alloy coating layer and the alloying agent concentration of the first functional metal Ag alloy coating layer may be different.

The alloying agent concentration of the at least one further functional metal Ag alloy coating layer may be 0.15-0.35 at. %, 0.35-0.55 at. %, 0.55-0.75 at. %, 0.75-0.95 at. %, 0.95-1.15 at. %, 1.15-1.35 at. % of the functional metal coating layer, the rest being Ag.

The glazing may have a light transmittance of at least 20%, preferably at least 30% or at least 40% as determined according to the standard EN 410.

According to the invention, there is provided a window glass sheet formed by a glazing as described above.

According to the invention, there is provided a vehicle glass sheet formed by a glazing as described above.

According to a second aspect, there is provided a method of producing a glazing in the form of a window glass or vehicle glass. The method comprises providing a transparent glass substrate, applying, by Physical Vapor Deposition, at least one functional metal Ag alloy coating layer to the substrate, such that the Ag alloy coating layer consists essentially of Ag with an alloying agent selected from a group consisting of Mg, Al, Si, Ca, Ti, V, Cr, Mn, Fe, Ni, Cu, Zn, Ge, Zr, Nb, Mo, In, Sn, Hf, Ta or W. An alloying agent concentration is 0.15-1.35 at. %, preferably 0.20-1.00 at. %, more preferably 0.25-0.80 at. % of the coating layer, the rest being Ag, and the Ag alloy coating layer has a thickness of 5-20 nm, preferably 8-15 nm or 8-12 nm.

The alloying agent concentration may be 0.15-0.35 at. %, 0.35-0.55 at. %, 0.55-0.75 at. %, 0.75-0.95 at. %, 0.95-1.15 at. %, 1.15-1.35 at. % of the coating layer, the rest being Ag.

The Ag alloy coating layer may, but need not, be deposited directly on the substrate. Alternatively, there may be one or more additional layers between the Ag alloy coating layer and the substrate.

The method may further comprise providing at least two anti-reflective layers, each having at least one dielectric layer, such that each functional metal layer is sandwiched between two anti-reflective layers.

The method may further comprise providing at least one blocker layer immediately above and in direct contact with the functional metal layer.

The method may further comprise providing at least one seed layer immediately below and in contact with the functional metal layer.

The method may further comprise providing at least one diffusion barrier layer immediately on top of the transparent substrate.

The method may further comprise providing at least one top layer immediately onto the outermost anti-reflective layer.

The additional layers, such as anti-reflective layers, blocker layer, seed layer, diffusion barrier layer and top layer may be deposited by Physical Vapor Deposition (PVD).

The Ag alloy coating layer may be deposited from a Ag alloy sputtering target.

There is provided a sputtering target which may comprise a homogeneous body of Ag alloy target material. The Ag alloy target material consists essentially of Ag with an alloying agent selected from a group consisting of Mg, Al, Si, Ca, Ti, V, Cr, Mn, Fe, Ni, Cu, Zn, Ge, Zr, Nb, Mo, In, Sn, Hf, Ta or W. An alloying agent concentration is 0.15-1.35 at. %, preferably 0.20-1.00 at. % or 0.25-0.80 at. % of the Ag alloy coating layer, the rest being Ag.

The concentrations specified for the Ag alloy coating layer apply to the sputter target as well.

According to a third aspect, there is provided use of the Ag alloy sputter target as described above for applying a surface coating on a transparent glass substrate.

DETAILED DESCRIPTION

The concept disclosed herein will now be explained in more detail. Initially, the structure of a glazing is described, thereafter the method of producing such a glazing is described. Finally, characterization results of the glazing are discussed.

Figure 1:
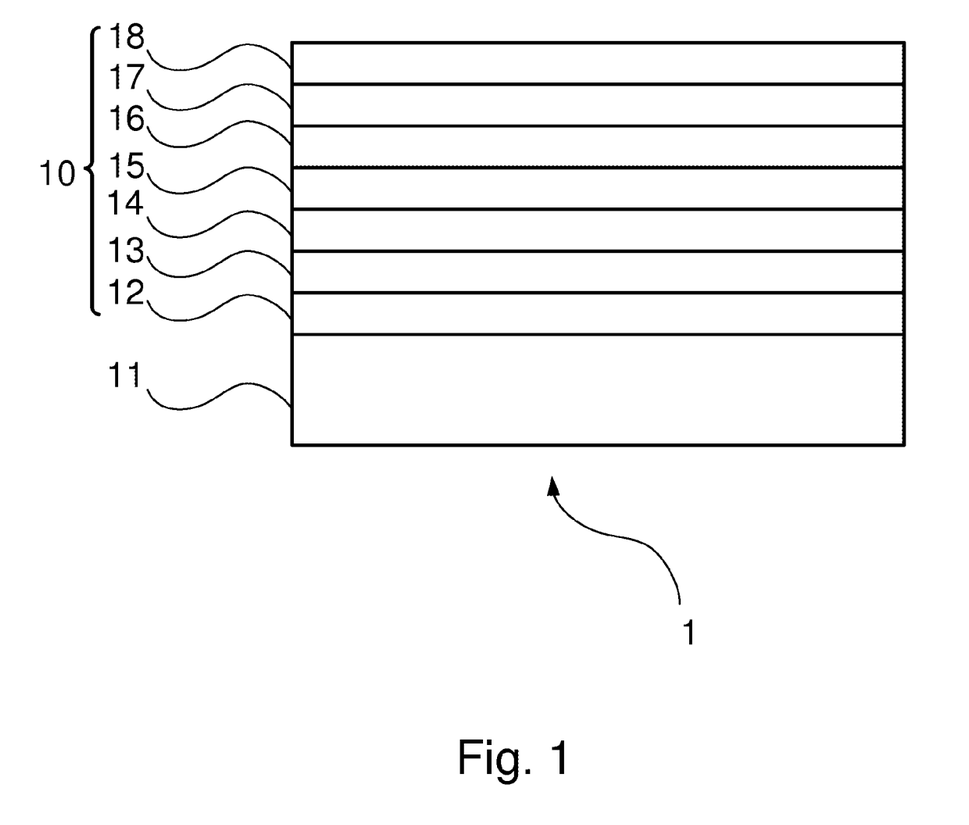
FIG. 1 schematically illustrates an example of a glazing structure.

In FIG. 1 a non-limiting example of a structure of a glazing 1 is schematically illustrated. When viewed from the bottom to the top, the glazing 1 comprises a transparent substrate 11 and a coating 10 comprising multiple layers of thin film materials. The coating 10 comprises an optional diffusion barrier layer 12, an antireflective layer 13, an optional seed layer 14, a functional metal layer 15, an optional blocker layer 16, an antireflective layer 17 and an optional top layer 18. The transparent substrate 11 may be a glass substrate, such as a soda-lime glass substrate, or a substrate of organic polymers. The substrate may be homogeneous or laminated, comprising one or more glass layers and, e.g., one or more polymer films. Preferably, an outwardly exposed surface, on which the coating is deposited, is made of glass.

The dimension of the transparent substrate 11 may range from over-sized glass panes, which, e.g., may be 3300×6000 mm or 3210×15000 mm or larger, down to small structures, e.g., 200×200 mm. The described glazing is, however, not limited to any specific size of the substrate.

The thickness of the transparent substrate may be about 0.4 mm to 25 mm, or about 2 mm to 8 mm or 4 mm to 6 mm. The described coating is, however, not limited to any thickness of the substrate 11.

An optional diffusion barrier layer 12 may be formed on the transparent substrate 11. The diffusion barrier layer may be a layer of $Al_2O_3$ or zinc stannate.

The diffusion barrier layer 12 may act as a barrier layer and the purpose of the diffusion barrier layer is to prevent Na ions from diffusing from the glass into the other layers, such as the functional metal layer, of the structure. Diffusion into the functional metal layer 15 may have detrimental effects on said layer.

The anti-reflective layer 13 may be formed either directly on the transparent substrate 11 or on the optional diffusion barrier layer 12.

The anti-reflective layer 13 may comprise at least one dielectric layer of a metal oxide, such as tin oxide, zinc oxide, zinc tin oxide, titanium oxide, silicon oxide, niobium oxide or zirconium oxide, or a metal nitride, such as silicon nitride or titanium nitride.

The purpose of the anti-reflective layer 13 is to tune the optical properties of the glazing 1 by tailoring the refractive index of the dielectric layers. The anti-reflective layer 13 may also protect the functional layer 15 from chemical attack and/or mechanical stress.

The thickness of the anti-reflective layer 13 may be about 5 to 120 nm, or about 15 to 100 nm, or about 20 nm to 90 nm.

On top of the antireflective layer 13, a seed layer 14 may be formed. The seed layer 14 may be a layer of zinc oxide or zinc oxide doped by an additional element, such as Al.

The purpose of the seed layer 14 is to improve the quality of the functional metal layer 15. For example, it may impose an epitaxial relationship for the functional metal layer 15 so that the crystallites in the functional metal layer 15 favour to grow with a (111) out-of-plane oriented texture and in that way increases conductivity of the functional metal layer 15.

The thickness of the seed layer 14 may be about 5 to 25 nm, or about 6 to 15 nm.

The functional metal layer 15 may be formed onto the seed layer 14 or directly on the anti-reflective layer 13.

The functional metal layer 15 is Ag alloyed with Mg, Al, Si, Ca, Ti, V, Cr, Mn, Fe, Ni, Cu, Zn, Ge, Zr, Nb, Mo, In, Sn, Hf, Ta or W. The functional metal layer may have high IR reflectivity characteristics.

The purpose of the functional metal layer 15 is to reduce the heat transfer through the glazing, while still being transparent in the visible spectrum.

The thickness of the functional layer 15 may be about 5 to 20 nm, or about 8 to 15 nm, or about 8 nm to 12 nm.

The structure 1 may further comprise an optional blocker layer 16 formed on top of the functional metal layer 15.

The blocker layer 16 may be an oxidized metal layer, based on nickel chrome, nickel, chrome, niobium, titanium or zinc, or a metal nitride layer, based on nickel chrome or chrome.

The purpose of the blocker layer 16 is to improve the quality of the functional metal layer 15 by protecting the functional metal layer during deposition of a subsequent layer, such as the anti-reflective layer 17.

The thickness of the blocker layer 16 may be about 0.5 to 4 nm, or about 0.5 to 2 nm.

The antireflective layer 17 may then be formed on the blocker layer 16 or directly on the functional metal layer 15. The antireflective layer 17 may comprise at least one dielectric layer.

The purpose of the antireflective layer 17 is to tune the optical properties of the glazing 1 by tailoring the refractive index of the dielectric layers.

The anti-reflective layer 17 may also protect the functional layer 15 from chemical attack and/or mechanical stress.

The thickness of the anti-reflective layer 17 may be about 5 to 120 nm, or about 15 to 100 nm, or about 20 nm to 90 nm.

A top layer 18 may be formed on the antireflective layer 17.

The top layer 18 may comprise a nitride, e.g., silicon nitride, or an oxide, e.g., aluminum oxide or titanium oxide.

The purpose of the top layer 18 is to protect the underlying layers from mechanical damage, e.g., scratches, and chemical attacks.

The coating 10 may be used as a so-called low-emissivity coating or as a so-called solar control coating. The emissivity of such a coating is typically ≤0.10, preferably ≤0.07.

The main purpose of a low-emissivity coating is to reflect heat (long wavelength IR radiation, such as 5-50 μm) back into the interior of, e.g., a building such that the heat is not lost to the outside of the building.

The main purpose of a solar control coating is to reflect solar heat (near wavelength IR radiation, such as 780-2500 nm) such that the interior of, e.g., a building or a vehicle is not heated by the sun.

For a low-emissivity coating, typically only one single functional metal layer sandwiched between two anti-reflective layers, together with optional layers discussed above, is formed on the substrate, such as a glass pane, thus forming a glazing.

For a solar control coating, two or three of the functional metal layers may be combined in a coating layer structure to form a glazing. Excluding the optional layers, the layer structure of a glazing comprising two functional metal layers may be glass/anti-reflective layer/functional metal layer/anti-reflective layer/functional metal layer/anti-reflective layer. A layer structure of a glazing comprising three functional metal layers may be glass/anti-reflective layer/functional metal layer/anti-reflective layer/functional metal layer/anti-reflective layer/functional metal layer/anti-reflective layer.

Method for Production of the Glazing

Each of the layers of the coating 10 in FIG. 1 is formed by Physical Vapor Deposition (PVD), such as magnetron sputtering, evaporation, arc evaporation, pulsed laser deposition and combinations thereof. Preferably, the layers are deposited by magnetron sputtering.

The layers of the coating 10 may be deposited one layer at a time.

The different layers may be deposited in the same or in different sputter zones. The sputter zones may be spatially separated.

Alternatively, the sputter zones may be completely or partially overlapping sputtering zones.

The sputter zones may be stationary and the transparent substrate may be moveable. The transparent substrate may be passed through a sputter zone or between successive sputter zones by means of translation, and/or rotation of the substrate in relation to the sputter zones.

Alternatively, the substrate may be stationary and the sputter zones may surround and face, or at least partially face, the stationary substrate.

The dimensions of the sputtering zones may depend on the application and on the size of the substrate to be coated.

The deposition sources may be so-called sputtering targets.

There may be different deposition sources used for each deposited layer. Alternatively, the same deposition source may be used for deposition of a number of different layers.

The functional metal layer may be deposited from one single deposition source, such as an alloy sputtering target. Alternatively, the functional metal layer is deposited from two separate deposition sources. For example, there may be one deposition source providing the Ag and one deposition source providing the alloying agent. If the functional metal layer is deposited from separate deposition sources, the deposition of Ag and the alloying agent may take place simultaneously.

Each of the deposited layers may, but need not, form a continuous layer onto the previous layer or onto the substrate.

Prior to deposition of the functional metal layer 15, additional layers may be deposited onto the substrate. Examples of such layers are a diffusion barrier layer 12, an anti-reflective layer 13 and/or a seed layer 14.

Additional layers may be deposited onto the functional metal layer 15. Examples of such layers are a blocker layer 16, an anti-reflective layer 17 and/or a top layer 18.

As an example, for deposition of the functional metal layer, the PVD system in which the deposition of layers take place may have a base pressure of about $10^{-2}$ Pa or below. A typical pressure in the PVD system when using a sputtering gas, such as Ar, is typically in the range of 0.1 to 2 Pa.

Typically, the substrate is not intentionally heated during deposition of the layers of the coating.

Characterization Results of the Glazing

Figure 2:
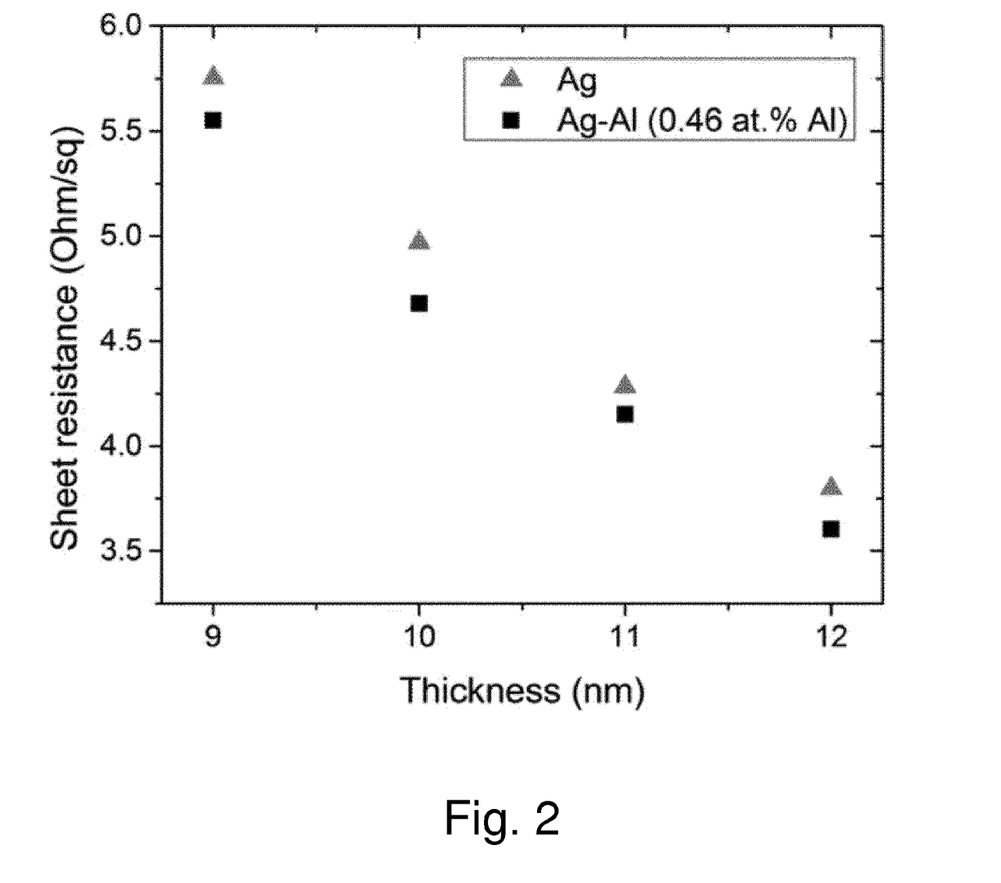
FIG. 2 illustrates the relation between the sheet resistance and the thickness of unalloyed Ag functional metal layers and Al-alloyed Ag functional metal layers, respectively.

FIG. 2 shows the sheet resistance as a function of the functional metal layer thickness of a glazing comprising an unalloyed Ag functional metal layer and a silver aluminum alloy functional metal layer (0.46 at. % Al), respectively. As can be seen, the sheet resistance of the glazing comprising the silver aluminum alloy functional metal layer is lower as compared to the unalloyed Ag metal functional layer for all thicknesses. A lower sheet resistance for the same layer thickness is equivalent to a lower emissivity and a higher IR reflectivity, which in turn corresponds to a lower heat transfer through the glazing, i.e., the glazing has a higher energy saving potential. In addition, a lower sheet resistance may mean a higher quality of the functional metal layer, which may lead to less light absorption within the function metal layer and thus a higher transmittance of visible light.

Figure 3A:
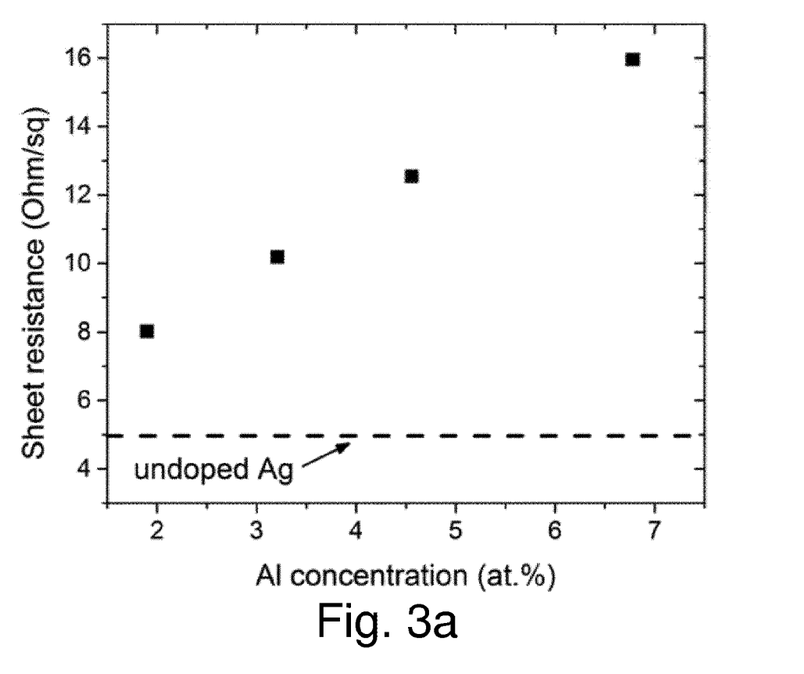
FIG. 3a and FIG. 3b illustrate the relation between the sheet resistance and the Al concentration of Al-alloyed Ag functional metal layers for high and low Al concentrations, respectively.
Figure 3B:
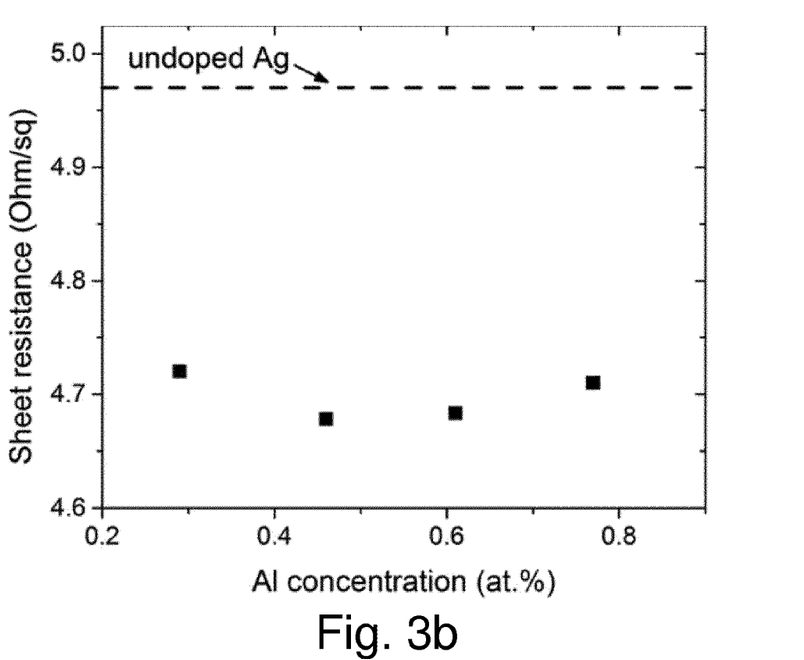

In FIG. 3a and FIG. 3b, the sheet resistance of silver aluminum alloy functional metal layers with a thickness of 10 nm is shown for different Al concentrations. FIG. 3a shows the sheet resistance for Al concentrations ranging from 1.5 at. % to 7.5 at. %, while FIG. 3b shows the sheet resistance for Al concentrations ranging from 0.2 at. % to 0.9 at. %. As can be seen in FIG. 3b, the sheet resistance is lower for silver aluminum alloy functional metal layers with an Al concentration of 0.29 to 0.77 at. % as compared to an unalloyed Ag functional metal layer. For higher Al concentrations, from about 2 to 7 at. % of the functional metal layer, the sheet resistance is significantly higher as compared to an unalloyed Ag functional metal layer, see FIG. 3a.

It is unexpected and surprising that the sheet resistance is very low in the alloying agent concentration interval of about 0.15 to 1.35 at. %. As seen in FIG. 3a it is expected that there is a linear relationship between increasing Al concentration and increasing sheet resistance. However, unexpectedly there is a minimum sheet resistance at an alloying agent concentration of about 0.5 at. % as shown in FIG. 3b. In the prior art documents found, 0.1 to about 10 at. %, or higher, alloying agent concentrations is typically shown.

Figure 4A:
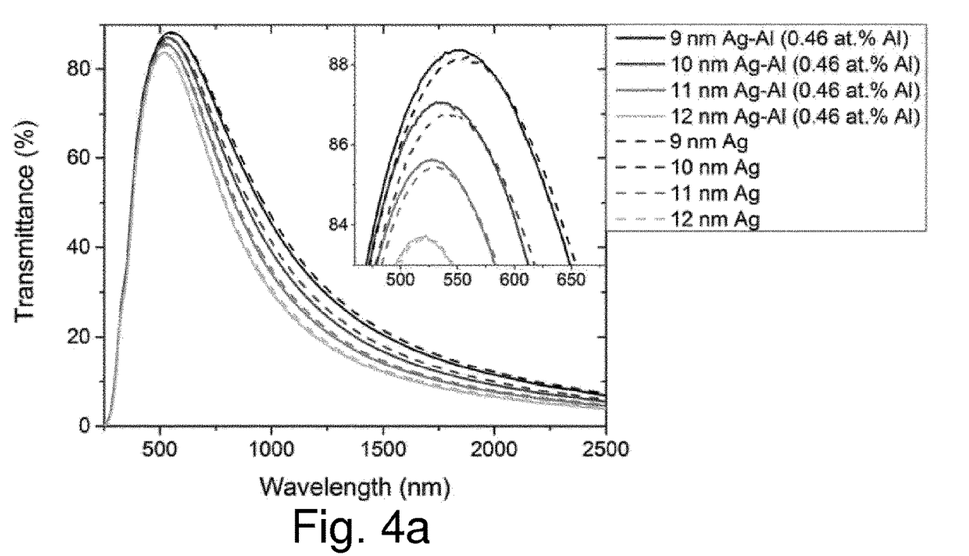
FIG. 4a illustrates the transmittance at different wavelengths of unalloyed Ag functional metal layers and Al-alloyed Ag functional metal layers having different thicknesses, respectively.

FIG. 4a shows the transmittance of glazings comprising a silver aluminum alloy functional metal layer and an unalloyed Ag layer, respectively, of different thicknesses. Results from functional layers of different thicknesses are included to show that the effect is applicable to more than one thickness. As illustrated in FIG. 4a, the transmittance of the glazings are high in the visible spectrum, such as 380 to 780 nm wavelengths, while being significantly lower in the near-IR part of the spectrum, such as 780 to 2500 nm. If comparing the transmittance of unalloyed Ag and silver aluminum alloy functional metal layers of the same thicknesses it can be seen that the silver aluminum alloy functional metal layers exhibit a lower transmittance in the near-IR region and at the same time that the maximum transmittance of the silver aluminum alloy functional metal layers is higher in the visible region.

Figure 4B:
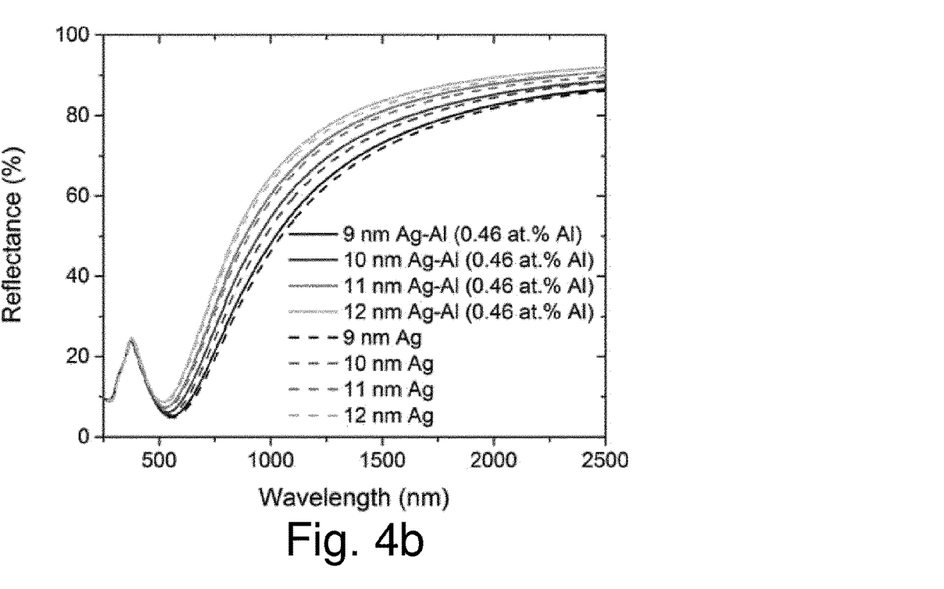
FIG. 4b illustrates the reflectance at different wavelengths of unalloyed Ag functional metal layers and Al-alloyed Ag functional metal layers having different thicknesses, respectively.

FIG. 4b shows the reflectance of glazings comprising a silver aluminum alloy functional metal layer and an unalloyed Ag layer, respectively, of different thicknesses. Results from functional layers of different thicknesses are included to show that the effect is applicable to more than one thickness.

The lower transmittance of the silver aluminum alloy functional metal layers as compared to the unalloyed Ag layers in the near-IR region shown in FIG. 4a is due to a higher reflectance in this region, as seen in FIG. 4b.

Ag is known to nucleate three-dimensional atomic islands when grown on weakly bonding surfaces, such as commonly used oxide or nitride layers deposited prior to the functional metal layer. A hypothesis is that by adding an alloying agent that is more prone to bond to an oxide/nitride than Ag (i.e., the bond strength of alloying agent to oxide/nitride is greater than the bond strength of Ag to oxide/nitride), the alloying agent may promote lateral over vertical island growth. This reduces the aspect ratio of the islands and lowers overall surface roughness as compared to the growth of an unalloyed Ag layer, yielding a morphology improvement beneficial for higher conductivity. In addition, a more preferential bonding to oxides/nitrides of the alloying agent as compared to between alloying agent and Ag (i.e., a more favorable enthalpy of mixing of the alloying agent-oxide/nitride than the enthalpy of mixing of alloying agent-Ag) also provides a driving force for alloying agents to diffuse towards the oxides/nitrides. This effectively lowers the alloying agent concentration within the crystallites, causing less electron scattering inside the crystallites and hence an increased conductivity. The alloying agent concentration thus needs to be selected within a range that is high enough to positively affect the morphology, while still being low enough to minimize electron scattering inside the crystallites.

Experimental Details

Coatings, comprising multiple thin layers, were deposited by means of magnetron sputtering on 100×100 mm² glass substrates in an inline coater. Two different deposition series were produced, one where the alloying agent (in this example Al) concentration of the functional metal Ag alloy coating layer was varied at a constant metal layer thickness of 10 nm and one where the alloying agent (in this example Al) concentration of the functional metal Ag layer was held constant at 0.46 at. % for different functional metal layer thicknesses. For reference, unalloyed Ag functional metal layers were also deposited at otherwise the same process conditions. The deposition sequence was initiated by first depositing a 7 nm thick dielectric layer consisting of ZnO:Al (2 wt. % Al), after which the functional metal coating layer was deposited. On top of this, a 1.6 nm thick blocker layer consisting of sub-stoichiometric ZnO:Al (2 wt. % Al) was deposited prior to the deposition of a 35 nm thick dielectric layer consisting of ZnO:Al (2 wt. % Al).

The electrical properties of the coatings were measured using a 4-point probe to determine the sheet resistance. The optical properties in terms of transmittance and reflectance of the glazing were measured with an UV/VIS/NIR spectrophotometer in the wavelength range 250-2500 nm.

The alloying agent concentration of the functional metal layer was determined using wavelength dispersive X-ray spectroscopy measurements of about 200 nm thick functional metal layers deposited directly on silicon substrates without the deposition of any other layers.

The invention claimed is:

1. A glazing in the form of a window glass or vehicle glass, comprising:
    a transparent glass substrate, and a coating, comprising at least one functional metal Ag alloy coating layer,
wherein the Ag alloy coating layer consists of Ag with an Al alloying agent and inevitable impurities,
wherein the alloying agent is present in a concentration of 0.15 to 0.77 at. % of the Ag alloy coating layer, the rest being Ag, and
wherein the Ag alloy coating layer has a thickness of 5-20 nm.

2. The glazing as claimed in claim 1 wherein the glazing presents a direct solar transmittance, as determined according to the European standard EN 410, which is lower than a direct solar transmittance of a glazing having a comparative coating with the same layer structure and layer thicknesses as the Ag alloy coating layer, wherein in the comparative coating, the Ag alloy coating layer is replaced by an unalloyed Ag functional metal layer.

3. The glazing as claimed in claim 1, wherein the glazing presents a direct solar reflectance, as determined according to the European standard EN 410, which is higher than a direct solar reflectance of a glazing having a comparative coating with the same layer structure and layer thicknesses as the Ag alloy coating layer, wherein in the comparative coating, the Ag alloy coating layer is replaced by an unalloyed Ag functional metal layer.

4. The glazing as claimed in claim 1, wherein the coating further comprises at least two anti-reflective layers, each having at least one dielectric layer, wherein each Ag alloy coating layer is sandwiched between two anti-reflective layers.

5. The glazing as claimed in claim 1, wherein the coating further comprises at least one blocker layer located immediately above and in direct contact with the Ag alloy coating layer.

6. The glazing as claimed in claim 1, wherein the coating further comprises at least one seed layer located immediately below and in contact with the Ag alloy coating layer.

7. The glazing as claimed in claim 1, wherein the coating further comprises at least one diffusion barrier layer located immediately on top of the transparent glass substrate.

8. The glazing as claimed in claim 4, wherein the coating further comprises at least one top layer located immediately onto the outermost anti-reflective layer.

9. The glazing as claimed in claim 1, further comprising at least one further functional metal Ag alloy coating layer,
wherein the at least one further Ag alloy coating layer consists of Ag with an Al alloying agent and inevitable impurities,
wherein the alloying agent is present in a concentration of 0.15-1.35 at. % of the at least one further Ag alloy coating layer, the rest being Ag, and
wherein the at least one further Ag alloy coating layer has a thickness of 5-20 nm.

10. The glazing as claimed in claim 1, wherein the glazing has a light transmittance of at least 20% as determined according to the standard EN 410.

11. A method of producing a glazing in the form of window glass or vehicle glass, comprising:
providing a transparent glass substrate,
applying, by Physical Vapor Deposition, at least one functional metal Ag alloy coating layer to the substrate, such that
the Ag alloy coating layer consists of Ag with an Al alloying agent and inevitable impurities,
wherein the alloying agent is present in a concentration of 0.15 to 0.77 at. % of the coating layer, the rest being Ag, and
the Ag alloy coating layer has a thickness of 5-20 nm.

12. The method as claimed in claim 11, wherein the method further comprises providing at least two anti-reflective layers, each having at least one dielectric layer, such that each Ag alloy coating layer is sandwiched between two anti-reflective layers.

13. The method claimed in claim 11, wherein the method further comprises providing at least one blocker layer immediately above and in direct contact with the Ag alloy coating layer.

14. The method as claimed in claim 11, wherein the method further comprises providing at least one seed layer immediately below and in contact with the Ag alloy coating layer.

15. The method as claimed in claim 11, wherein the method further comprises providing at least one diffusion barrier layer immediately on top of the transparent glass substrate.

16. The method as claimed in claim 12, wherein the method further comprises providing at least one top layer immediately onto the outermost anti-reflective layer.

17. The method as claimed in claim 11 wherein the functional metal Ag alloy coating layer is deposited from an Ag alloy sputtering target, wherein the Ag alloy sputtering target consists of Ag with an Al alloying agent and inevitable impurities, wherein the alloying agent is present in a concentration of 0.15 to 0.77 at. % of the Ag alloy sputtering target, the rest being Ag.

* * * * *